United States Patent [19]
Ohashi

[11] Patent Number: 4,635,490
[45] Date of Patent: Jan. 13, 1987

[54] PUSH-BUTTON TUNER
[75] Inventor: Tamaki Ohashi, Tokyo, Japan
[73] Assignee: Nihon Technical Kabushiki Kaisha, Tokyo, Japan
[21] Appl. No.: 660,931
[22] Filed: Oct. 15, 1984
[30] Foreign Application Priority Data Oct. 17, 1983 [JP] Japan .................. 58-192600

[51] Int. Cl.$^4$ .................. H03J 5/12
[52] U.S. Cl. .................. 74/10.33; 334/7
[58] Field of Search .................. 74/10.33; 334/7

[56] References Cited
FOREIGN PATENT DOCUMENTS 55-27719 2/1980 Japan .................. 74/10.33

Primary Examiner—Allan D. Herrmann
Attorney, Agent, or Firm—Robert E. Burns; Emmanuel J. Lobato; Bruce L. Adams

[57] ABSTRACT

Disclosed is a push-button tuner in which two desired preset broadcasting frequencies can be tuned in by one push-button. The push-button tuner comprises a plurality of tuning mechanisms each constituted by an operation shaft, and a pair of tuning shafts disposed on the opposite sides of the operation shaft. These operation shaft and tuning shafts are supported movably between the front non-actuation position and the rear actuation position, the operating shaft being provided with a drive gear, a change-over mechanism for alternatively alternately causing the pair of tuning pieces to move relative to the operation shaft to the rear actuation position every one reciprocation of the operation shaft between the front non-actuation position and the rear actuation position, and an enlarging mechanism for enlarging the amount of moving stroke of the operation shaft member and for transmitting the enlarged amount of moving stroke to one of the tuning member which is in its movable state. Each of the tuning shafts includes a driven gear which engages with the drive gear when the tuning shaft is moved to the front non-actuation position, and a tuning piece which is axially movable in response to the rotation of the tuning shaft. The tuning piece selects the frequency of the variable element in response to the axial movement of the tuning shaft.

9 Claims, 26 Drawing Figures

FIG. 2
FIG. 3
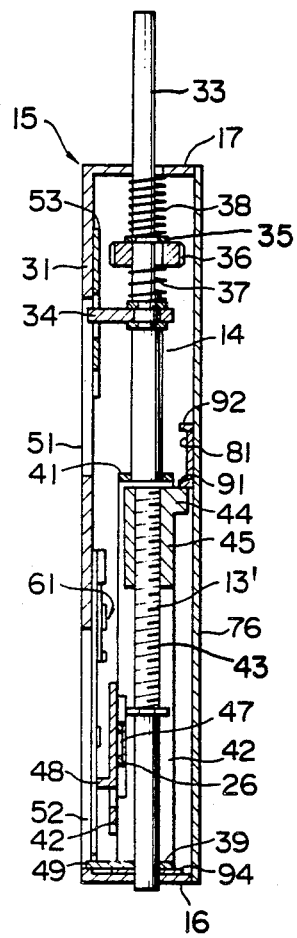
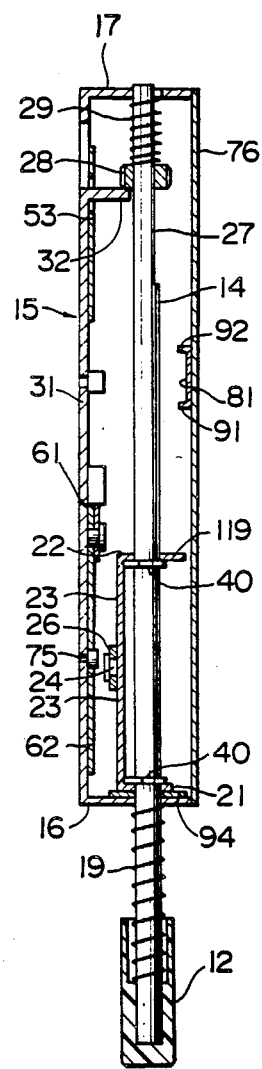

FIG.11
FIG.12
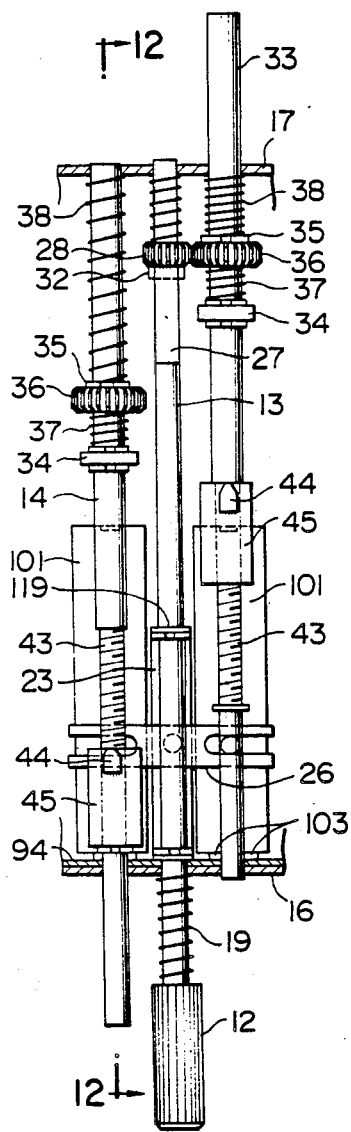
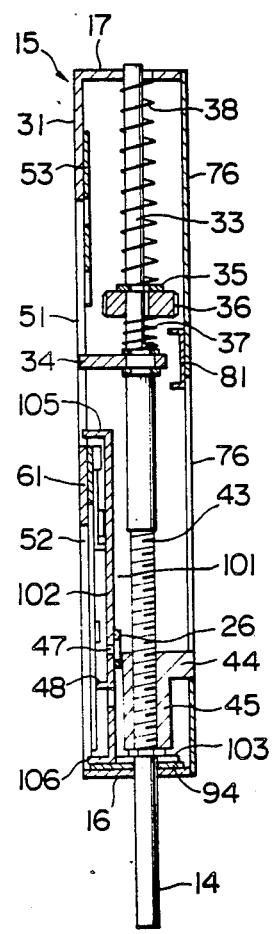

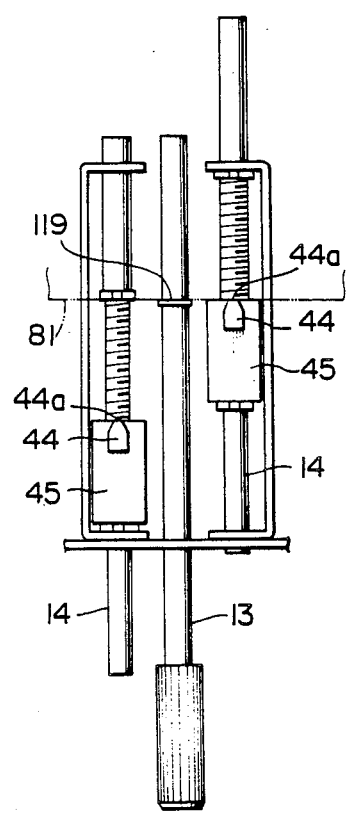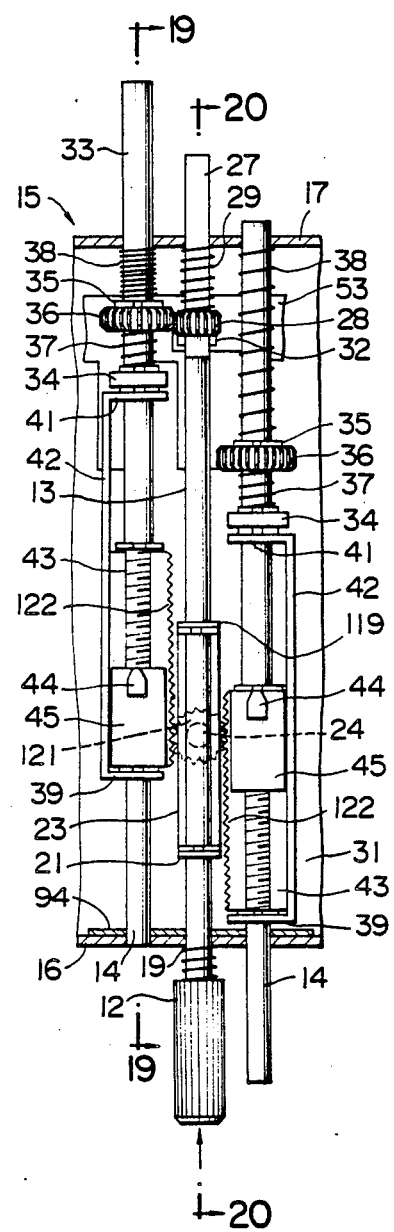

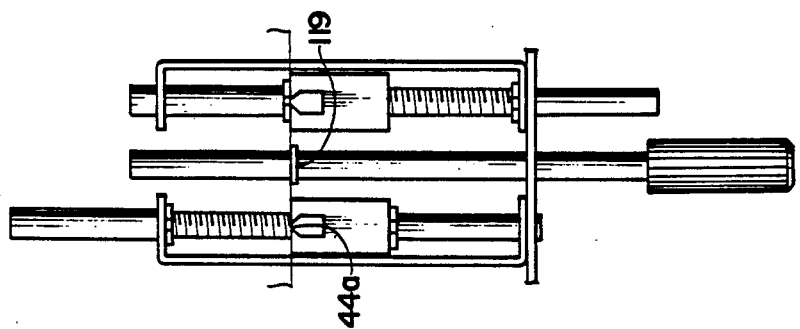
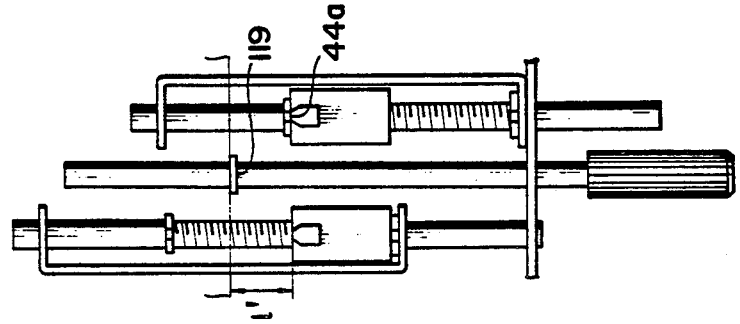
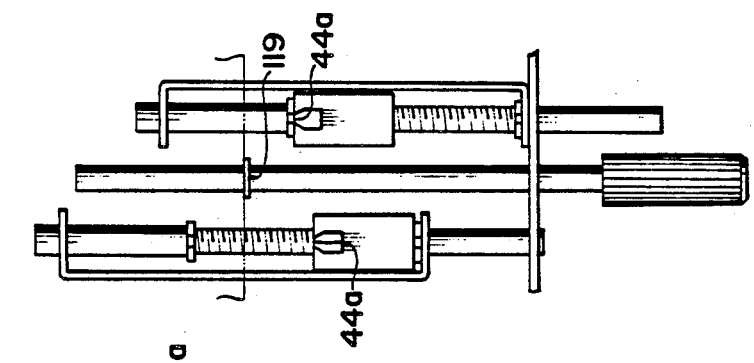
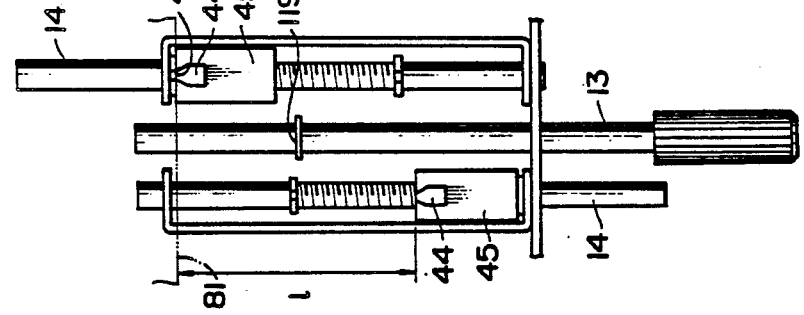

FIG. 19
FIG. 20
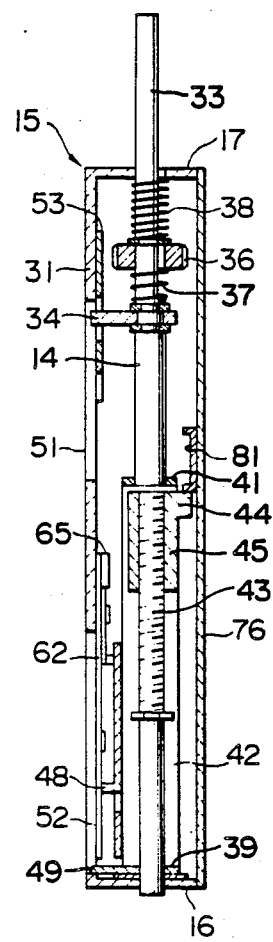
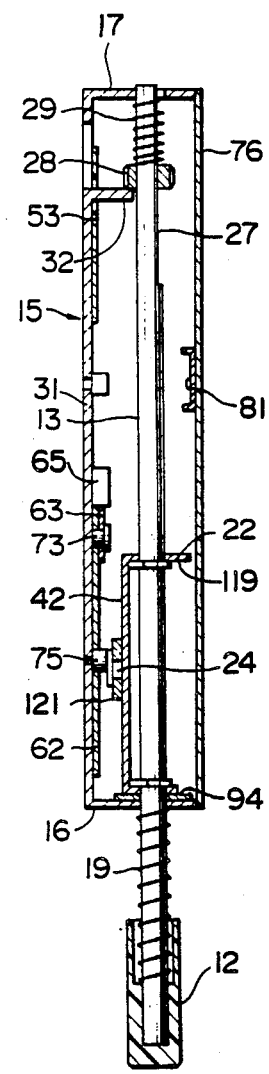

PUSH-BUTTON TUNER

BACKGROUND OF THE INVENTION

1. Field of the Invention

The present invention generally relates to push-button tuners for radio receivers and more particularly to a push-button tuner in which two preset broadcasting frequencies can be selectively tuned in by each push-button.

2. Description of Prior Art

Widely known is a push-button tuner having a plurality of push-buttons each of which is set to tune in to a preset broadcasting frequency so that a desired broadcasting frequency is tuned in by depressing a selected one of the push-buttons into its actuated position. In such a push-button tuner, usually, only one broadcasting station could be selected by one push-button so that in order to tune in to a plurality of broadcasting stations by push-buttons, it has been required to provide a plurality of push-buttons corresponding in number to the number of the broadcasting stations. To increase the number of the push-buttons, however, it was necessary to enlarge the size of the tuner per se, and thus there was a limit as to the number of numbers of broadcasiting station by which could be selected using a small sized tuner.

Accordingly, there has been proposed a push-button tuner in which a pair of adjacent tuning members are provided with each push-button disposed therebetween and the selected one of the tuning members is interlinked with the push-button so that two different broadcasting stations can be selected by each push-button, whereby it is made possible to select a number of broadcasting stations which is two times as large as the number of push-buttons. For example, Japanese Utility Model Publication No. 21397/1982, which relates to an invention invented by the same inventor of the present application, discloses a push-button tuner which comprises a pair of tuning members located at the opposite sides of each push-button member and a change-over member for manually selectively changing over the tuning members to restrict the movement of the selected one of the tuning members. A mechanism for displacing a tuning member by means of movement of the the push-button member is constituted by a pinion rotatably mounted on the push-button member and a rack provided on the tuning member and meshed with the pinion. In order to displace a desired one of the pair of tuning members, the push-button member is depressed after the other tuning member has been fixed by the change-over member. Thus, the pinion moves, while rotating, along the rack on the fixed tuning member. At the same time, the desired tuning member is displaced by means of the movement of the push-button member and the rotation of the pinion.

The change-over member changes over the frequency band, for example, between an AM band and an FM band, in accordance with the change-over position thereof. Thus, the pair of tuning members disposed at the opposite sides of the push-button member are caused to tune in to different frequency bands respectively. Accordingly, it is necessary to operate the change-over member every time the tuning operation is changed from the AM band to the FM band, and vice versa. Even if five push-button members are provided to make it possible to tune in to ten radio stations, five of the stations are allotted for the AM band, while the remainder five stations are alloted for the FM stations. That is, it is impossible to effect such allotment that four and six stations are allotted for the AM and FM bands respectively.

SUMMARY OF THE INVENTION

An object of the present invention is to provide a push-button tuner in which a plurality of different frequency band radio stations can be selectively tuned in and which is made reduced in size.

Another object of the present invention is to provide a push-button tuner in which a selected one of two tuning members is operated by one push-button, the selection of the one tuning member to be operated being attained only by depression of the pushing member, and in which the selected one tuning member is moved a large distance in accordance with a slight depressing stroke of the push-button.

According to an aspect of the present invention, the push-button tuner comprises a support, a tuning means mounted on the support in a manner so that the tuning means is movable to positions corresponding to tuned frequencies for producing the tuned frequencies, and a plurality of presettable tuning mechanisms for adjusting the tuning means to move selectively to positions respectively corresponding to specific frequencies. Each of the tuning mechanisms comprises: a rotatable operation member movable between a front non-actuation position and a rear actuation position, the operation member being normally urged to the front non-actuation position, the operation member having a drive rotary body and a push-button provided at an end of the operation member, and the push-button being used also as a knob; a pair of rotatable tuning members each having a driven rotary body selectively engaged with the drive rotary body to thereby rotate together with the drive rotary body, each of the rotatable tuning members being supported by the support in a manner so that the rotatable tuning member is normally urged to the front non-actuation position while it is movable between the front non-actuation position and the rear actuation position, each of the rotatable tuning members having a longitudinally extending threaded portion at a part of the surface thereof and a tuning piece engaged with the threaded portion, the tuning piece being movable in the frontward/rearward direction in response to the rotation of the tuning member; an engagement mechanism supported by the operation member for engaging with the pair of tuning members such that the pair of tuning members are alternately disposed to the rear actuation position relative to the operation position every one reciprocation of the operation shaft between the front non-actuation position to the rear actuation position; and the enlarging mechanism for enlarging an amount of movement of the operation member toward the rear actuation position and for transmitting the enlarged amount of movement to one of the tuning member which is movable to the rear actuation position. The tuning means includes an actuator plate for engaging with the tuning piece of one of the pair of tuning members which is in the rear actuation portion to thereby adjusting the tuning means. The push-button tuner further comprises a lock member for holding any one of the tuning members so as to permit the transmission of rotation between the drive rotary body and the driven rotary body when the one tuning member is located in the rear actuation position and for releasing the one tuning member held in the rear actuation position when another tuning member is disposed in the rear actuation position.

The above and other objects, features, and advantages of the present invention will be apparent when read the following description in conjunction with the accompanying drawings.

BRIEF DESCRIPTION OF THE DRAWINGS

FIG. 2 is a longitudinal sectional view taken on line 2—2 in FIG. 1;

FIG. 3 is a longitudinal sectional view taken on line 3—3 in FIG. 1;

FIG. 11 is an enlarged plan view showing only one tuning mechanism in the second embodiment;

FIG. 12 is a longitudinal sectional view taken on line 12—12 in FIG. 11;

FIGS. 15, 16a, 16b, 16c, and 16d are diagrams for explaining the operations of the above-mentioned embodiments;

FIG. 17 is an enlarged plan view showing only one tuning mechanism in a fourth embodiment of the present invention;

FIG. 19 is a longitudinal sectional view taken on line 19—19 in FIG. 17;

FIG. 20 is a longitudinal sectional view taken on line 20—20 in FIG. 17;

DESCRIPTION OF PREFERRED EMBODIMENTS

Figure 1:
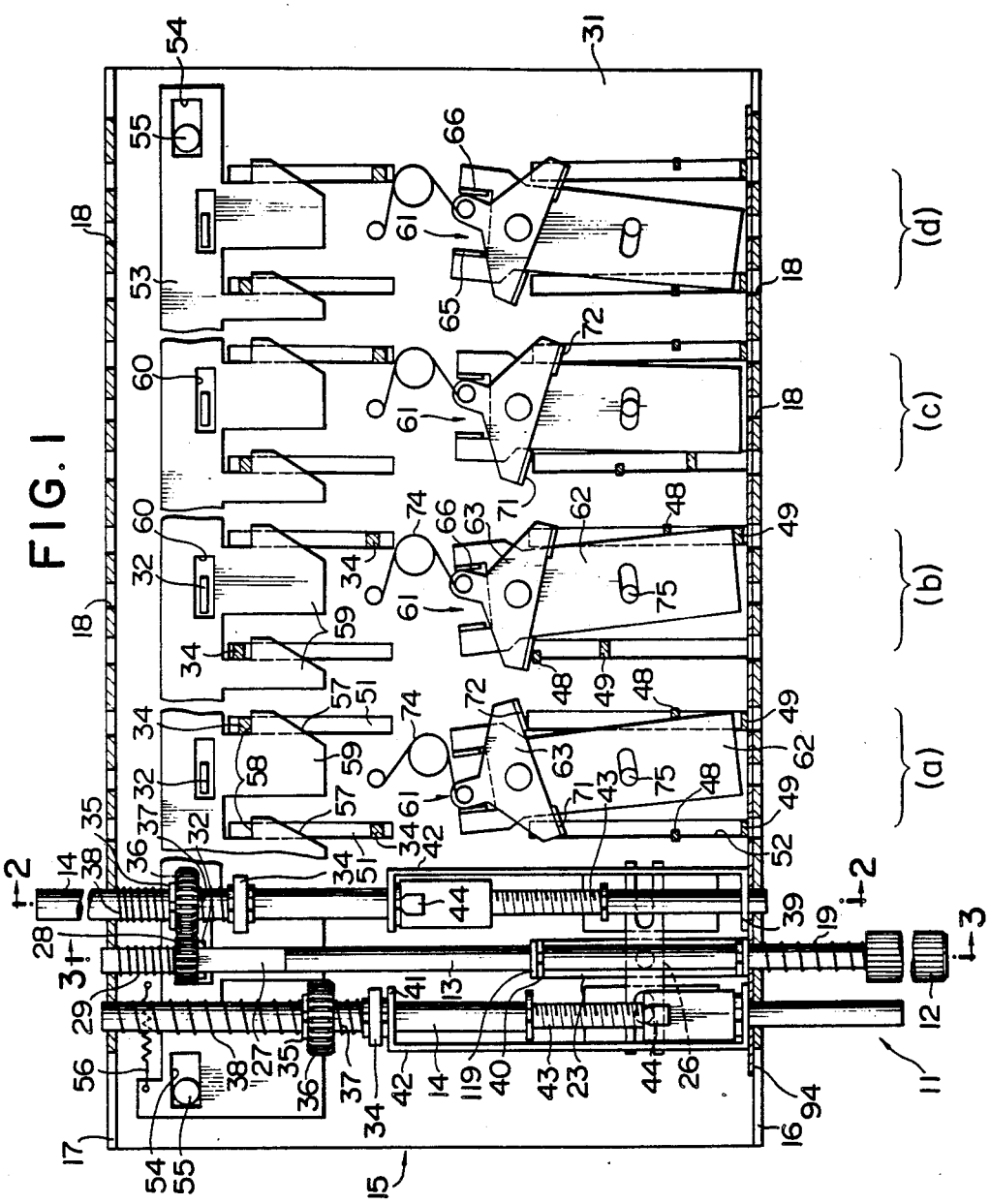
FIG. 1 is a partly cut away plan view of a first embodiment of the push-button tuner according to the present invention.
Figure 4:
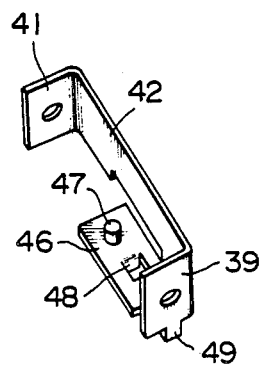
FIG. 4 is a perspective view showing in detail the guide member of FIG. 1.

Referring to the drawings, preferred embodiments of the present invention will be described hereunder. The same element or part is designated by the same reference numeral in the several embodiments, and the explanation of the same element or part as described in a preceding embodiment is omitted in the description of the succeeding embodiments.

Referring to FIGS. 1 to 9, a first embodiment of the push-button tuner according to the present invention will be described. In this embodiment, ten broadcasting stations are tuned to by five sets of tuning mechanisms each having a single push-button. Since each of the tuning mechanisms has the same construction, only one of the tuning mechanisms is described and illustrated and a description of the remaining four tuning mechanisms is omitted. The tuning mechanism is generally designated by reference numeral 11 and the tuning mechanism 11 has a cylindrical push-button 12 attached at the forward end thereof, an operation shaft 13 attached to the push-button 12, and two tuning shafts 14 and 14 respectively arranged at the opposite sides, that is right and and left sides in the drawing, of the operation shaft 13. In the following description, the word "front" is defined as the side at which the push-button 12 is attached and the word "rear" is defined as the side at which the push-button 12 is not attached. The respective front and rear portions of the operation shaft 13 and the tuning shafts 14 and 14 are inserted into and supported by through holes 18 formed in a front-end and a rear-end rising portion 16 and 17 of a support plate 15, movably in front and in the rear.

A helical spring 19 for elastically urging the operation shaft 13 in the frontward direction is inserted between the push-button 12 of the operation shaft 13 and the front-end rising portion 16. A support member 23 having bent portions 21 and 22 at its front and rear ends is provided on the operation shaft 13 between the front-end and rear-end portions 16 and 17 such that the operation shaft 13 is inserted through through holes formed in the bent portions 21 and 22 so as to be supported by the support member 23. This support member 23 is attached to the operation shaft 13 by means such as washers 40 in a manner so that it is allowed to move in the rotary direction of the operation shaft 13 but prevented from moving in the axial direction of the operation shaft 13. When the push-button 12 is released from being urged rearwardly, the bent portion 21 of the support member 23 is normally in contact with the rear surface of the front-end rising portion 16 in order to restrict the frontward movement of the operation shaft 13 by the eleastic force of the spring 19. A pin 24 is provided at the center of the rear surface of the support member 23 and an interlocking member 26 having a pair of slots 25 at its opposite ends is pivotally mounted on the pin 24. A rear portion 27 of the operation shaft 13 is axially partly cut away so as to make the cross-section non-circular and a drive gear 28 is fitted into this non-circular portion such that it is allowed to slide in the axial direction of the operation shaft 13 while being prevented from moving in the rotary direction of the same. A helical spring 29 is mounted on the operation shaft 13 between the drive gear 28 and the rear-end rising portion 17 so as to always elastically urge the drive gear 28 frontwardly. The other surface of the drive gear 28 opposite to the surface contacting with the helical spring 29 abuts on a restriction portion 32 which is cut up from a bottom plate 31 of the support plate 15 so as to restrict the movement of the drive gear 28 in the axial direction of the operation shaft 13.

The pair of tuning shafts 14 and 14 cooperating with the operation shaft 13 each have the same structure. Accordingly, description is made only about one of the tuning shafts 14, while as to the other tuning shaft 14 the same portions as those of the one tuning shaft 14 are designated by the same reference numerals and the explanation thereabout is omitted here. The tuning shaft 14 is circumferentially rotatably and axially slidably supported at its front and rear portion by the front-end and rear-end rising portions 16 and 17 of the support plate 15. The rear portion 33 of the tuning shaft 14 is partly cut away along the axial direction thereof so that the cross section is made non-circular similarly to the rear portion 27 of the operation shaft 13. An engagement/stopper piece 34 is mounted on the forward end of the rear portion 33 in such a manner that the piece 34 is movable in the rotational direction of the tuning shaft 14, while being fixed in the axial direction of the same. A washer 35 is fixed onto the rear portion 33 of the tuning shaft 14 behind the engagement/stopper piece 34 with an interval therefrom. A driven gear 36 is mounted on the rear portion 33 at a portion between the engagement/stopper piece 34 and the washer 35, the driven gear 36 being engageable with the drive gear 28 of the operation shaft 13 and having a diameter larger than that of the drive gear 28. The driven gear 36 is mounted on the rear portion 33 such that it is rorata- ble in the rotational direction of the tuning shaft 14, while being fixed in the axial direction of the same. A helical spring 37 for always urging the driven gear toward the washer 35 is provided between the engagement/stopper piece 34 and the driven gear 36. A helical spring 38 for always urging the tuning shaft 14 frontward is provided at the rear portion 33 between the washer 35 and the rear-end rising portion 17.

A guide member 42 having bent portions 39 and 41 at its opposite ends is mounted on the tuning shaft 14 between an engagement/stopper surface of the guide member 42 between its opposite bent portions 39 and 141 and is perpendicular to the surface of the bottom plate 31 of the support plate 15 so that the guide member 42 is swingable about the tuning shaft 14 but prevented from axially moving there along by washers. That is, the tuning shaft 14 is loosely passed through through holes (not shown) formed in the respective bent portions 39 and 41. A threaded portion 43 is formed in the outer periphery of the tuning shaft 14 within the guide member 42 and a tuning piece 45 is engaged with the threaded portion 43, the tuning piece 45 having an upwardly projecting memory protrusion 44 formed on the upper surface thereof.

Figure 6:
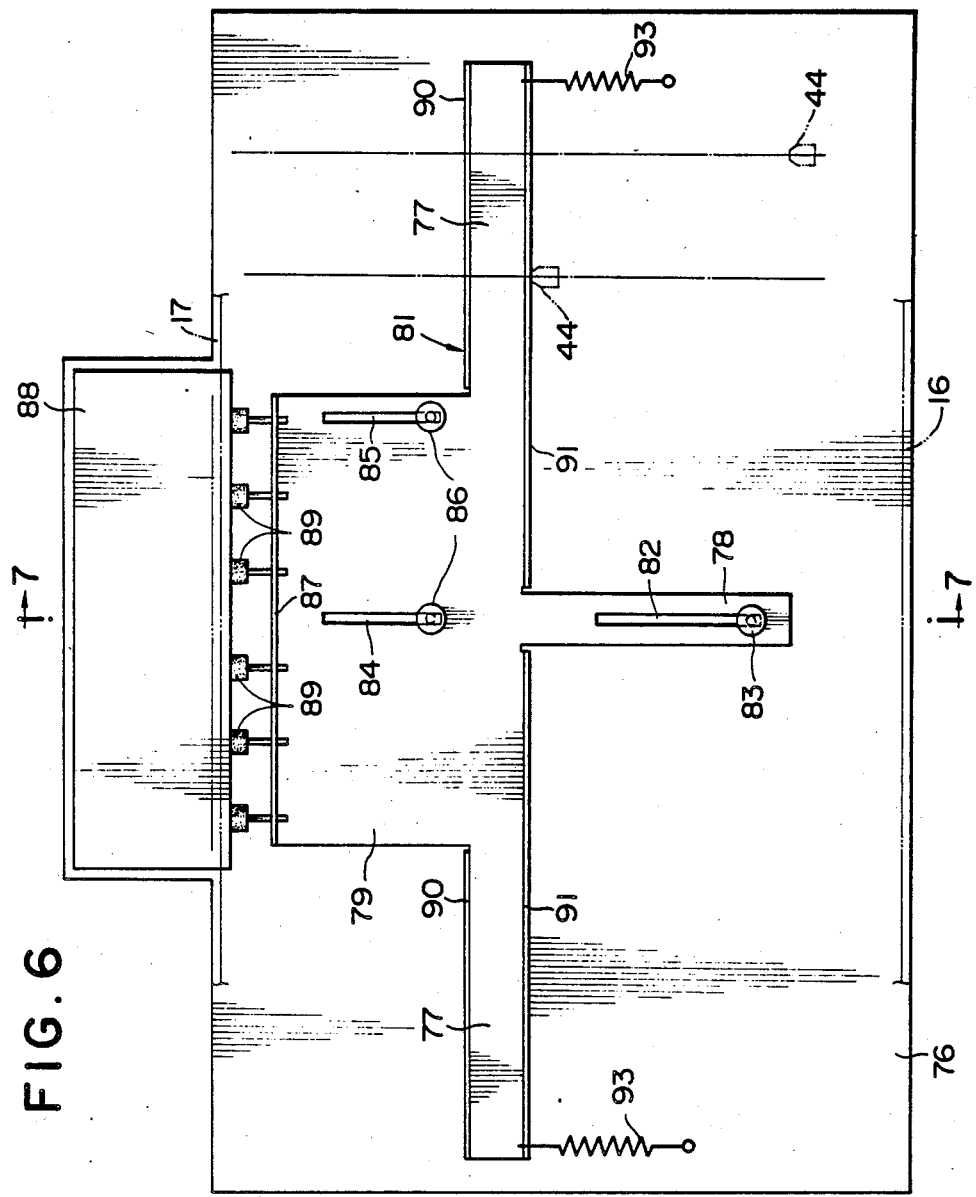
FIG. 6 is a plan view showing the arrangement of the tuning means.

As shown best in FIG. 6, the guide member 42 has, in addition to the bent portions 39 and 41, a lower horizontal portion 46 which is bent parallelly with the bottom plate 31 of the support plate 15, a pin 47 which is formed on the lower horizontal portion 46 and which is fitted into the slit 25 of the interlocking member 26, a downwardly projecting butt portion 48, and a protrusion 49 integrally formed at a lower portion of the bent portion 39. In the bottom plate 31 of the support 15, are provided a first elongated guide slot 51 which engages with the front end of the engagement/stopper piece 34 for guiding the frontward/rearward movement of the latter, and a second elongated guide slot 52 which engages with the protrusion 49 of the guide member 42 for guiding the frontward/rearward movement of the latter. Each of the first and second elongated slots 51 and 52 are located directly below the tuning shaft 14 and longitudinally extended in the axial direction of the tuning shaft 14.

A lock plate 53 is provided movably perpendicularly to the operation shaft 13 on the rear portion of the bottom plate 31 of the support plate 15. Longitudinally elongated holes 54 are formed in the longitudinally opposite ends of the lock plate 53, and pins 55 respectively planted in the bottom plate 31 are fitted in the elongated holes 54 so as to restrain the amount of movement of the lock plate 53 in the left-right direction. One and the other ends of a spring 56 are attached to the bottom plate 31 and the lock plate 53 respectively so as to elastically bias the lock plate 53 rightwardly. A cam member 59 is formed in the front edge of the lock plate 53, and provided with a ramp edge 57 which is formed in order to engage with the engagement/stopper portion 34 when the tuning shaft 14 retreats and to temporarily displace the lock plate 53 in the leftward direction in FIG. 1 against the spring 56, and with an engagement/stopper step portion 58 which is formed in the rear portion of the edge 57 and which engages with and stops the engagement/stopper portion 34. In the lock plate 53, elongated holes 60 extending in the left-right direction are formed at portions corresponding to the respective restriction portions shaft 32, and the engagement/stopper portions 34 are engaged with first elongated guide slots 51 through the elongated holes 60.

The front portion of the bottom plate 31 of the support plate 15 is provided with a change-over mechanism 61 for alternately preventing the left and right tuning shafts 14 from retreating. The change-over mechanism 61 is provided with a longitudinal swing plate 62 and a pivotal plate 63 which is disposed at the rear side of the swing plate 62. The swing plate 62 is provided with a fitting hole 64 at its middle portion, a pair of rising portions 65 and 66 opposite to and separated from each other at its rear portion, and a circularly-arced connecting hole 67 at its front portion. The rear portion of the pivotal plate 63 is disposed between the pair of rising portions 65 and 66, and a pin 68 is planted in this rear portion. A fitting hole 69 registered with the fitting hole 64 and a pair of contact portions 71 and 72 engaging with the butt portion 48 of the guide member 42 are formed in the center of the front portion of the pivotal plate 63. A pivot shaft 73 is inserted into the fitting holes 64 and 69 registered with each other and fixedly attached at its lower end to the bottom plate 31 so that the swing plate 62 and the pivotal plate 63 are rotatably supported. One and the other ends of a snap spring 74 are respectively attached to the bottom plate 31 and the pin 68 of the pivotal plate 63 so as to elastically maintain the pivotal plate 63 at a state rotated in one direction. The swing plate 62 of the change-over mechanism 61 is disposed between the pair of the left and right second guide slots 52 and attached to the bottom plate 31 such that the front edge of the swing plate 62 closes either the left-hand or right hand second guide slot 52 when the swing plate 62 inclines either left or right. Further, a connecting pin 75 with its one end attached to the bottom plate 31 is fitted in the connecting hole 67 which is in opposition to the butt portion 48 of the guide member 42 attached to the left and right tuning shafts 14 and in opposition to the contact portions 71 and 72 of the pivotal plate 63.

Figure 7:
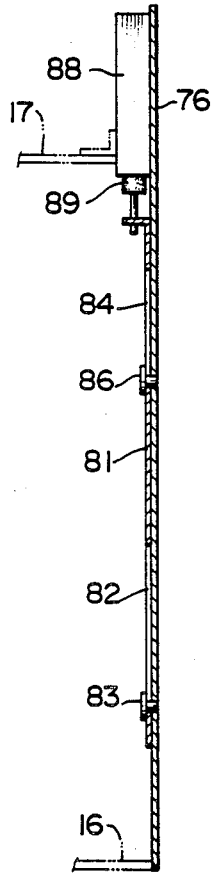
FIG. 7 is a longitudinal sectional view taken on line 7—7 in FIG. 6.
Figure 5:
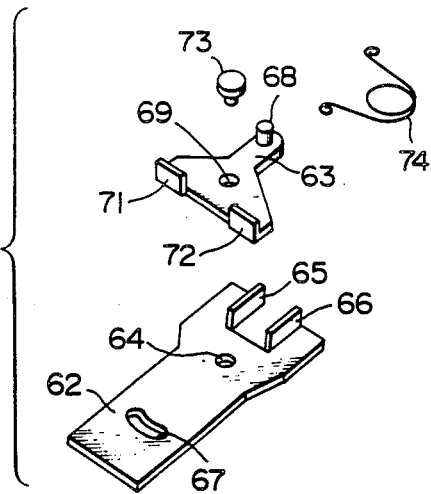
FIG. 5 is an exploded perspective view of the change-over mechanism of FIG. 1.

An upper plate 76 is provided such that it is mounted on the respective upper ends of the front-end and rear-end rising portions 16 and 17 of the support plate 15. On the inner surface of this upper plate 76, as shown in FIGS. 6 and 7, there is provided an actuator plate 81 integrally formed with bracket portions 77 and 77 at its right and left sides, a frontward extending support portion 78 and its front end center portion, and a wide width portion 79 at its rear end center portion. A longitudinally or frontward/rearward extending elongated hole 82 is formed in the support portion 78, and pin 83 with its one end attached onto the rear surface of the upper plate 76 is fitted into this elongated hole 82, the other end of the pin 83 being provided with a flange which has a diameter larger than the width of the elongated hole 82. In the wide width portion 79, an elongated hole 84 similar to the elongated hole 82 is formed at the position aligned with the latter and another elongated hole 85 similar to the elongated hole 84 is formed on the right-hand of the latter with a distance therefrom as seen in FIG. 6, so that the wide width portion 79 is also supported on the rear surface of the upper plate 76 by means of flanged pins 86 to thereby make the actuator plate 81 slidable relative to the upper plate 76 in the frontward/rearward direction. A substantially rectangularly downward bent portion 87 is formed at the rear end of the wide width portion 79 and respective magnetic cores 89 of conventionally well known variable tuning elements 88 are coupled with the bent portion 87. Similarly, substantially rectangularly downward bent portions 91 and 92 are formed at the rear and front ends, respectively, of each of the right and left blacket portions 77 of the actuator plate 81. The actuator plate 81 is always elastically urged in the frontward direction by a spring 93 with its one end fixed to the upper plate 76 and the other end attached to the actuator plate 81. A buffer plate 94 for the support member 23 and the guide member 42 is provided on the rear surface of the frontend rising portion 16 of the support plate 15.

Figure 8:
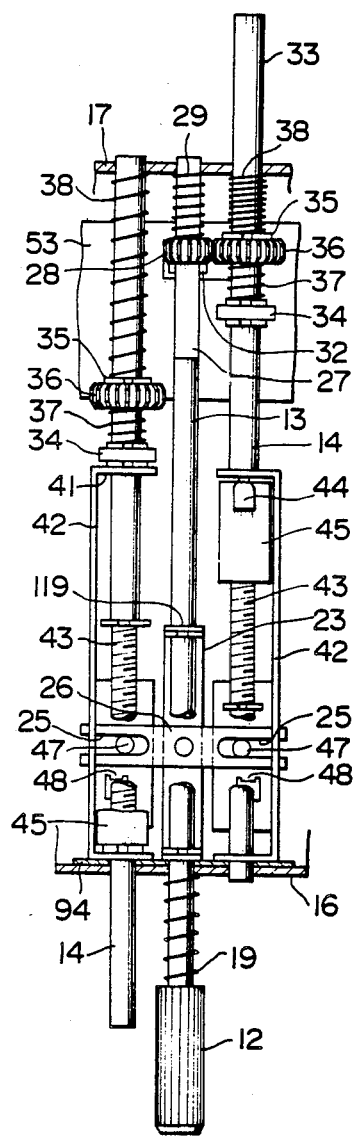
FIG. 8 is an enlarged plan view showing only one tuning mechanism in FIG. 1.

In FIG. 1, the tuning shaft 14 located at the right side of the operation shaft 13 has moved rearward and the engagement/stopper 34 is engaging with the engagement/stopper step portion 58 of the lock plate 53 so that the left-most tuning mechanism 11 is maintained in its retreated state. The operation shaft 13, the guide member 42 of the right-hand tuning shaft 14 and the left-hand tuning shaft 14 are in their returned state. Assume that, at that time, both the swing plate 62 and the pivotal plate 63 of the change-over mechanism 61 have been rotated in the counterclockwise direction, as shown at (a) in FIG. 1. This state is shown in FIG. 8, and when the push-button 12 is turned in this state, the right-hand tuning shaft 14 rotates because the drive gear 28 meshes with the driven gear 36. The turning of the tuning shaft 14 causes the tuning piece 45 to move in the rearward/frontward direction on the tuning shaft 14. The side surface of the tuning piece 45 is in contact with the vertical side surface of the guide member 42 so that the tuning piece 45 can move without turning. The top of the memory protrusion 44 of the tuning piece 45 is in contact with the bent portion 91 of the actuator plate 81 so that the actuator plate 81 moves against the elastic force of a spring 93 according to the movement of the tuning piece 45. Consequently, the variable tuning element 88 is varied so that a desired radio station can be tuned in. After tuning, the selection of the desired radio station is fixed and memorized until the operation shaft 13 is rotated again.

Figure 9:
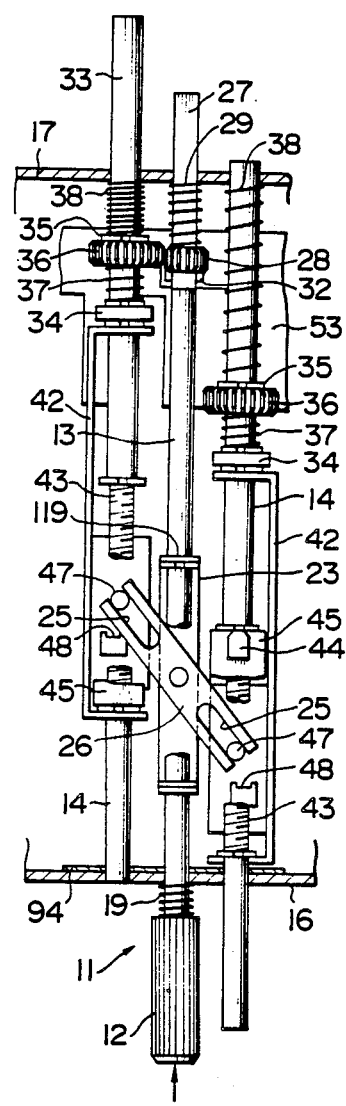
FIG. 9 is a diagram for explaining the operation of the tuning mechanism of FIG. 8.

Thus, after the desired radio station has been memorized in the right-hand tuning shaft 14 by means of the movement stroke of the tuning piece 45, the push-button 12 is depressed. As described above, the change-over mechanism 61 is in a state that a part of the front edge of the rotated swing plate 62 crosses the right-hand second elongated guide slot 52. Therefore, the protrusion 49 of the guide member 42 of the retreated right-hand tuning shaft 14 is prevented from moving rearward by means of the front edge of the swing plate 62. Thus, the interlocking member 26 moves rearward while pivoting about a fixed center, that is, the pin 47 of the guide member 42 is prevented from rearward movement. Accordingly, the left-hand guide member 42 with its pin 47 engaged with the interlocking member 26 is displaced rearward with a stroke two times as large as the stroke of rearward movement of the interlocking member 26. The engagement/stopper portion 34 is made to be in contact with the bent portion 41 of the guide member 42 by means of the return spring 38 so that the tuning shaft 14 moves rearward integrally with this guide member 42. In that case, the engagement/stopper portion 34 cooperates with the ramp edge 57 of the lock plate 53, and a transverse movement force against the spring 56 is temporarily applied to the lock plate 53. Consequently, the engagement between the engagement/stopper portion 34 of the right-hand tuning shaft 14 maintained at the rear and the engagement/stopper stepped portion 58 is released, so that the right-hand tuning shaft 14 is returned frontward by means of the return spring 38 independently of the guide member 42. On the other hand, the bent portion 81 of the actuator plate 78 which retreats as the right-hand tuning shaft 14 returns comes in contact with the memory protrusion 44 of the left-hand tuning shaft 14 which has been retreated with the operation shaft 13. Further, due to the engagement between the engagement/stopper portion 34 of the left-hand tuning shaft 14 and the engagement/stopper stepped portion 58 of the lock plate 53, the left-hand tuning shaft 14 is maintained at the rear position, and at this time the left-hand driven gear 36 meshes with the drive gear 28 as shown in FIG. 9. In this case, when the respective crests of the drive and driven gears 28 and 36 come into contact with each other, the drive and driven gears 28 and 36 move rearward and frontward against the springs 29 and 37 respectively, so that they are disengaged from each other. The engagement between the gears 28 and 36 can be automatically made by rotating the drive gear 28.

When the depressing pressure applied to the push-button 12 is removed in the state shown in FIG. 9, both the left-hand and right-hand guide members 42 are retreated and the drive gear 28 and the driven gear 36 are maintained in their meshed state. Next, the push-button 12 is turned in this state, and the turning is transmitted to the left-hand tuning shaft 14 so that the tuning shaft 14 is rotated. As described above, the driven gear 36 has a diameter which is larger than that of the drive gear 28 so that the tuning shaft 14 can be finely rotated. The rotation of the tuning shaft 14 causes the tuning piece 45 to move in the rearward/frontward direction on the tuning shaft 14 so that the variable tuning element 88 is varied finely through the actuator plate 78 to thereby select another desired radio station which is stored by means of the movement stroke of the tuning piece 45.

The operation of the change-over mechanism 61 will be described now. FIG. 1 shows, at (a) to (d), the operation steps of the change-over mechanism 61 which is changed over every cycle of reciprocation of the operation shaft 13. In the state maintained by the snap spring 74 such that both the pivotal plate 63 and the swing plate 62 lean in the counterclockwise direction as shown at (a) in FIG. 1, the butt portion 48 provided on the left-hand guide member 42 moves frontward and butts against the contact portion 71 of the pivotal plate 63 opposite thereto. Therefore, as shown at (b) in FIG. 1(b), the pivotal plate 63 clockwise reverses and butts at its leg end against the first rising portion 66, so that a clockwise pivotal force is given to the swing plate 62. When the depressing pressure onto the push-button 12 is removed in this state so that the left-hand guide member 42 is retreated together with the operation shaft 13 through the engagement with an interlocking member 26, the protrusion 49 retreats while sliding along the side edge of the swing plate 62 as shown at (c) in FIG. 1. In the state where the guide member 42 has been returned sufficiently, the swing plate 62 leans in the clockwise direction so as to transverse the left-hand second elongated guide slot 52, and this state is maintained by the snap spring 74. Thus, the change-over mechanism 61 is reversibly changed over alternately in the left and right directions at every reciprocation of the operation shaft 13.

Thus, after the desired radio stations have been respectively memorized in all the tuning shafts 14 provided on the support plate 15, if a desired one of the push-buttons 12 is depressed and the operation shaft 13 is moved rearward, one of the tuning shafts 14 in the state to be able to retreat is moved frontward at the same time. The radio station which has been memorized in the tuning piece 45 can be received through the variable tuning element by means of the butting contact between the memory protrusion 44 of the tuning piece 45 of the tuning shaft 14 which has been moved and of front bent portion 91 of the actuator plate 81.

This first embodiment is arranged such that the drive gear 28 is made movable only rearward, while the driven gear 36 is made movable only frontward relative to the tuning shaft 14, so that the drive and driven gears 28 and 36 come away rearward and frontward, respectively, from each other when the respective crests come into contact with each other. However, in the case where the driven gear 36 is arranged to be movable frontward the drive gear 28 may be fixed to the operation shaft 13. On the contrary, when the drive gear 28 is arranged to be movable rearward, the driven gear 36 may be fixed to the tuning shaft 14.

Figure 10:
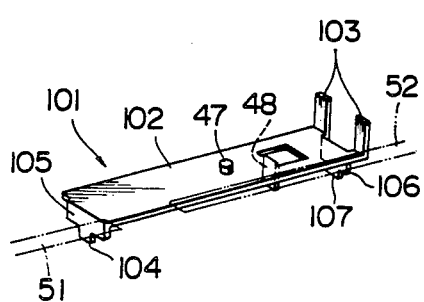
FIG. 10 is a perspective view of the guide member in a second embodiment of the present invention.

FIGS. 10 to 12 illustrate a second embodiment of the present invention which is another example of the case where a guide member is supported movably frontward/rearward relative to the support plate. That is, a guide member 101 has a base plate 102 having a downward projecting butt portion 48 and an upward projecting pin 47. A pair of upward bent portions 103 are integrally formed at the rear edge portion of the base plate 102 and separated therebetween with a space into which a tuning shaft 14 can be inserted. A downward bent portion 105 is formed at the front edge portion of the base plate 102, the bent portion 105 having a protrusion 104 which is fitted into a second elongated guide slot 52 formed in a bottom plate 31 of a support plate 15. At the rear end of the guide member 101, the lower end portion of the pair of bent portions 103 is bent downward to form a downward bent portion 106 and a protrusion 107 is formed at the lower end center portion of the downward bent portion 106, the protrusion 107 being fitted into a first elongated guide slot 51. As shown in FIGS. 10 and 11, the guide member 101 is rearward/frontward movably attached on the upper surface of the bottom plate 31 of the support plate 15. A guide slot 108 extending in the rearward/frontward direction is formed in the upper plate 76 at a portion corresponding to a memory protrusion 44 and the memory protrusion 44 is slidably fitted into the guide slot 108. A tuning piece 45 is slided rearward/frontward by means of this guide slot 108 as the tuning shaft 14 rotates.

Figure 14:
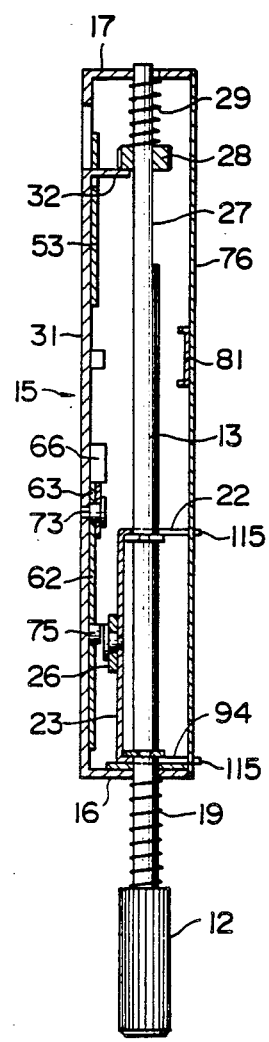
FIG. 14 is a longitudinal sectional view taken on the position of the operation shaft in the third embodiment.
Figure 13:
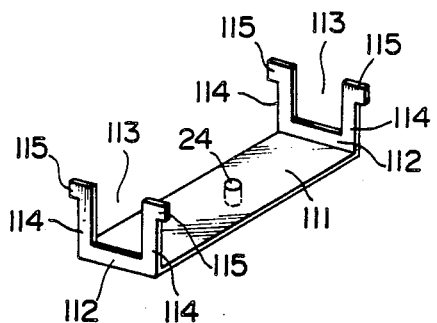
FIG. 13 is a perspective view of the support member in a third embodiment of the present invention.
Figure 18:
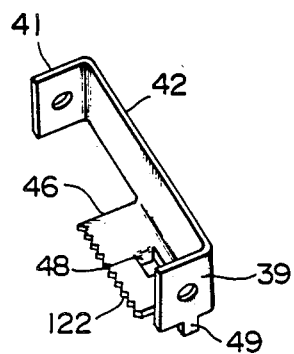
FIG. 18 is a perspective view of the support member in the fourth embodiment.
Figure 21:
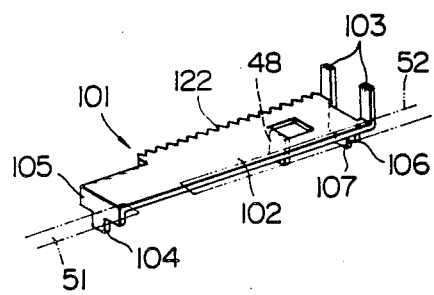
FIG. 21 is a perspective view showing another embodiment of the guide member.

FIGS. 13 and 14 illustrate a third embodiment of the present invention which shows an alternative embodiment of the support member 23 in the first embodiment. In this embodiment, a support member 111 is substantially rectangular bent upward at the opposite ends 112 and upward-opened openings 113 are formed in the respective bent ends 112 at the respective center portions thereof so that an operation shaft 13 can be inserted through those openings 113. Substantially rectangular outward projecting hook portions 115 are integrally formed at the upper ends of legs 114 at the opposite sides of each of the openings 113 at the front and rear end portions 112. These hook portions 115 are slidably inserted into guide slots (not shown) formed in the upper plate 76 at its portions corresponding to these hook portions 115. The insertion of the guide member 111 into the guide slots in the upper plate 76 may be attained in such a manner that after the hook portions 115 have been inserted into the guide slots extending to the front end portion of the upper plate 76, the upper plate 76 is fixed to the front-end rising portion 16 of the support plate 15.

In the above-mentioned embodiments in which the actuator plate 81 is displaced in the same direction as the operation shaft 13, however, there occurs inconvenience as will be described hereunder.

Assume now that the left-hand tuning shaft 14 is to be moved rearward together with the operation shaft 13 from the state in which the right-hand tuning shaft is held in the rear and the actuator plate 81 engages with the rear end of the memory protrusion 44 of the right-hand tuning shaft 14. In the process of this rearward movement, the left-hand tuning shaft 14 is returned by its returning spring 38, while the actuator plate 81 is also moved frontward by its returning spring 92 so as to butt with the the memory protrusion 44 of the left-hand tuning shaft 14 which is moving rearward to thereby cause a so-called hammer action. This strongest hammer action may be generated when the memory protrusion 44 is set at the rear-most position on one tuning shaft 14 and the memory protrusion 44 is set at the front-most position on the other tuning shaft 14. As a result, a rotational force somewhat acts onto the threaded portion between the tuning shaft 14 and the tuning piece 45 due to mechanical vibrations by this hammer action so as to cause erroneous tuning as well as a risk of mechanical damage at the butting portion.

According to the present invention, therefore, a butting portion is provided on the operation shaft such that when one of the pair of tuning shafts is in its non-tuning state and the other is in its tuning state and when the tuning pieces of both the tuning shafts are located at the respective front-most positions of the tuning shafts, the butting portion comes between the butting surfaces of the respective memory protrusions of the tuning pieces. Such a butting portion is designated with by reference numeral 119 as seen in FIGS. 1, 3, 9, and 11. More specifically, the butting portion 119 is formed to extend upward on the rear bent portion 41 of the support member 23. FIG. 15 illustrates the state in which the butting portion is caused to approach as close as possible the rear end butting surface 44a of the memory protrusion 44 of the left-hand tuning shaft 14 which is now in the tuning operation.

Referring to FIGS. 16(a) to 16(d), the butting action of the actuator plate 81 onto the butting portion 119 will be described hereunder. FIG. 16(a) illustrates the state in which the hammer action is the largest, that is, the the memory protrusion 44 of the right-hand tuning piece 45 which is in its tuning state is located at the rear-most position on the associated tuning shaft 14 and the actuator plate 81 is in contact with the butting surface 44a of the memory protrusion 44, while the memory protrusion 44 of the other tuning piece 45 which is in its non-tuning state is located at the front-most position of the associated tuning shaft 14. If the operation shaft 13 is moved rearward in this state, the right-hand tuning shaft 14 which is now in its tuning state moves frontward as described already in the process of the rearward moving operation of the operation shaft 13. As the right-hand tuning shaft 14 moves frontward, the actuator plate 81 butts on and is stopped by the butting portion 119, as shown in FIG. 16(b), before it butts on the butting surface 44a of the left-hand memory protrusion 44 which is in its non-tuning state. Then, if the operation shaft 13 is further moved rearward, the actuator plate 81 is caused to move rearward by the butting portion 119 and the actuator plate 81 is sufficiently pushed back by the butting portion 119, as shown in FIG. 16(c). At this time, if the rearward movement of the operation shaft 13 is released, the operation shaft 13 is returned back, and the actuator plate 81 moves frontward to come into contact with the butting surface 44a of the left-hand memory protrusion 44 as shown in FIG. 16(d). In this case, the left-hand memory protrusion 44 has moved frontward sufficiently together with the associated tuning shaft 14 so that actuator plate 81 is separated from the butting portion 119 and the distance from the actuator plate 81 to the butting surface 44a of the left-hand memory protrusion 44 is shortened to thereby weaken the hammer action.

That is, in the case where the butting portion 119 is not provided, the distance along which the actuator plate 81 is to be moved rearward is substantially equal to l as shown in FIG. 16(a), while in the case where the butting portion 119 is provided, the distance is reduced to l' as shown in FIG. 16(c). Further, the elastic force by the spring 93 of the actuator plate 81 is first received by the butting portion 119 and then the actuator plate 81 comes into soft contact with the butting surface 44a by the pulling force by a finger depressing the push-button 12. Accordingly, there is an advantage that the hammer action is weakened to eliminate errors in tuning operations as well as mechanical damages.

FIGS. 17 and 20 illustrate a fourth embodiment of the present invention which shows another embodiment of the enlarging mechanism for enlarging the pressing stroke of an operation shaft 13 and for transmitting the enlarged stroke to right- and left-hand tuning shafts 14. That is, a pinion 121 is rotatably mounted on a pin 24 of a support member 23 provided on the operation shaft 13, and a rack 122 which meshes with the pinion 121 is provided on a lower horizontal portion 46 of a guide member 42 at a portion in opposition to the pinion 121.

When the push-button 12 is depressed and the pinion 121 is moved rearward, since the selected one of the right-hand or left-hand guide members 42, for example, the right-hand guide member 42, is prevented from rearward moving by a change-over mechanism 61, the pinion 121 is guided by the right-hand rack 122 so as to move rearward while rotating. As the pinion 121 moves rearward, the guide member 42 of the left-hand tuning shaft 14 with its rack 122 meshed by the pinion 121 moves rearward by the amount corresponding to the rotation of the pinion 121, and since the depressing stroke of the operation shaft 13 is added to the movement of the left-hand guide member 42, the left-hand guide member 42 moves rearward with a stroke as large as the depressing stroke of the push-button 12. The guide member 42 is axially fixed to the tuning shaft 14, and thus the latter moves rearward as the former moves rearward.

Figure 22:
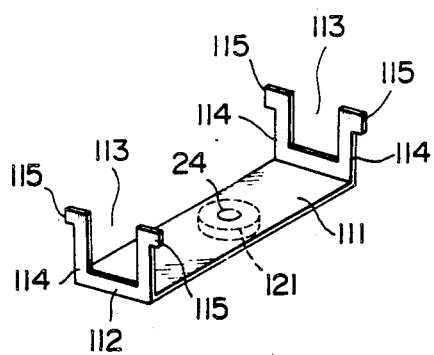
FIG. 22 is a perspective view showing another embodiment of the support member.

Such an enlarging mechanism with a set of rack and pinion may be provided also in the above-mentioned second embodiment similarly to the fourth embodiment. In this case, a pinion 121 may be provided in quite the same manner as in the fourth embodiment, while a rack 122 is formed on the base plate 102 at its side edge opposed to the pinion 121 as shown in FIG. 2. Further, such an enlarging mechanism may be provided in the third embodiment. In this case, a pinion 121 may be rotatably mounted on a pin 24 formed on the rear surface of the support member 111 as shown in FIG. 22.

In the enlarging mechanism with a set of pinion and rack as described above, any one of the tuning shafts 14 is moved rearward and the rear-most position of the tuning shaft 14 is restricted by the abutment between the engagement/stopper portion 34 and the rear end of the first elongated guide slot 51. Accordingly, the depressing force of the push-button 12 acting on the operation shaft 13 is received by the engagement portion between the rack 122 and the pinion 121 so that there is a risk of mechanical damages on the respective tooth of the rack 122 and the pinion 121 as well as on the bearing portion of the pinion 121.

Figure 23:
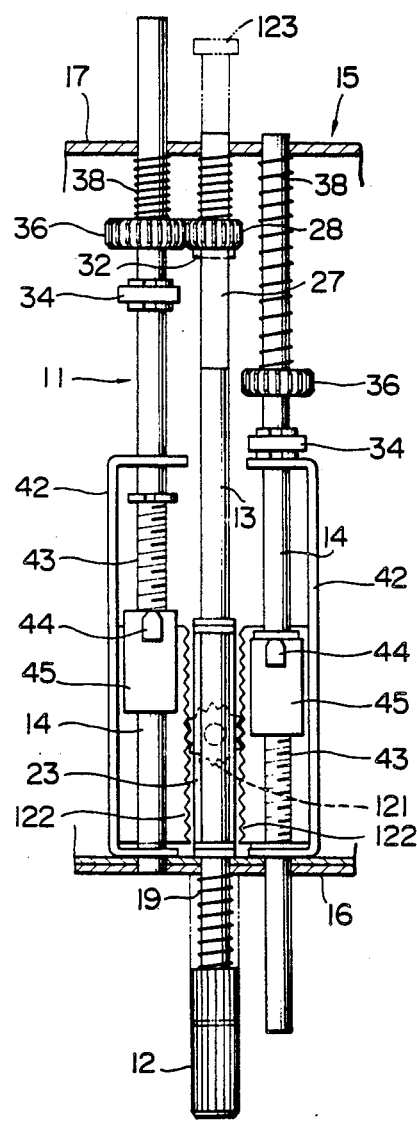
FIG. 23 is an enlarged plan view showing only one tuning mechanism in a fifth embodiment of the present invention.

To cope with this drawback, in a fifth embodiment of the present invention illustrated in FIG. 23, the abutment between the engagement/stopper portion 34 and the rear end of the first elongated guide slot 51 is avoided and, alternatively, when the tuning shaft 14 moved rearward by the operation shaft 13 has reached a position where it is held by the lock plate 53, the rearward movement of the operation member 13 is prevented. That is, the push-button 12 is attached to the operation shaft 13 such that the front-end rising portion 16 of the support plate 15 is separated from the rear end of the push-button 12 in the state of non-depression by a distance which is slightly longer than the distance along which the push-button 12 is depressed from the state where the tuning shaft 14 is in its front position to the state where the tuning shaft engages with the engagement/stopper stepped portion 58 of the lock plate 53. Thus, if the the push-button 12 is depressed rearward, the rear end surface of the push-button 12 comes into contact with the front end surface of the front-end rising portion 16 when the engagement/stopper portion 34 has engaged with the lock plate 53, and the operation shaft 13 is not moved rearward unnecessarily.

This restriction mechanism may be constituted by a rear portion restricting member 123 for restricting the amount of movement of the operation shaft 13 at the rear end thereof, as indicated by a phantom line in FIG. 23. The distance between the rear portion restricting member 123 and the rear-end rising portion 17 is equal to the distance between the rear end of the push-button 12 and the front-end rising portion 16. The rear portion restricting member 123 may be supported at its lower portion by the rear-end rising portion 17 (not shown). Although not shown in the drawing, slanted edge portions to be engaged with the respective memory protrusions of the tuning pieces may be formed at the front end portion of the actuator plate so that the actuator is moved laterally in the direction perpendicularly to the operation shaft by the butting between the slanted edge portion and the memory protrusion to thereby change the variable tuning element.

What is claimed is:

1. A push-button tuner comprising: a support, tuning means mounted on said support in a manner so that said tuning means is movable to positions corresponding to tuned frequencies for producing the tuned frequencies, and a plurality of presettable tuning mechanisms for adjusting said tuning means to move selectively to positions respectively corresponding to specific frequencies, in which each of said tuning mechanism comprises:

a rotatable operation member movable between a front non-actuation position and a rear actuation position, said operation member being normally urged to said front non-actuation position, said operation member having a drive rotary body and a push-button provided at an end of said operation member, said push-button defining a rotating knob for effecting rotation of the operation member;

a pair of rotatable tuning members each having a driven rotary body selectively engaged with said drive rotary body to thereby rotate together with said drive rotary body, each of said rotatable tuning members being supported by said support in a manner so that said rotatable tuning member is normally urged to said front non-actuation position while it is movable between said front non-actuation position and said rear actuation position, each of said rotatable tuning members having a longitudinally extending threaded portion and a tuning piece threadedly engaged with said threaded portion, said tuning piece being movable in the frontward and rearward directions in response to the rotation of said tuning member;

an engagement mechanism coacting with said operation member for engaging with said pair of tuning members such that said pair of tuning members are alternately displaced to said rear actuation position relative to said operation position every one reciprocation of said operation member between said front non-actuation position to said rear actuation position;

an enlarging mechanism for enlarging the amount of movement of said operation member toward said rear actuation position and for transmitting the enlarged amount of movement to one of said tuning member which is movable to said rear actuation position;

said tuning means including an actuator plate for engaging with said tuning piece of one of said pair of tuning members which is in said rear actuation portion for adjusting said tuning means; and said push-button tuner further comprising locking means including a lock member for holding any one of said tuning members so as to permit the transmission of rotation between said drive rotary body and said driven rotary body when said one tuning member is located in said rear actuation position and for releasing said one tuning member held in said rear actuation position when another tuning member is displaced to said rear actuation position.

2. A push-button tuner according to claim 1, in which said enlarging mechanism includes a support member movable in response to the frontward and rearward movements of said operation member, a pinion horizontally rotatably mounted on said support member, and a guide member movable in response to the frontward and rearward movements of said operation member and having a rack engaging with said pinion.

3. A push-button tuner according to claim 1, in which said enlarging mechanism includes a support member movable in response to the frontward and rearward movements of said operation member, an interlocking member horizontally rotatably supported at its middle portion by said support member, guide members movable in response to the frontward and rearward movements of said operation member, and coupling means for coupling said interlocking member at its one end with the guide member of one of said tuning members and at its other end with the guide member of the other one of said tuning members such that each of said tuning members is movable in the frontward and rearward directions.

4. A push-button tuner according to claim 3, in which said coupling means comprises longitudinally extending slots formed at the opposite ends of said interlocking member and pins respectively provided on said guide members and slidably fitted in said slots.

5. A push-button tuner according to claim 1, further comprising restricting means operative when one of said tuning members is moved rearward by said operation member and is held by said lock member for preventing said operation member from further rearward moving.

6. A push-button tuner according to claim 1, in which said driven rotary body has a diameter which is larger than that of said drive rotary body.

7. A push-button tuner according to claim 1, in which said drive rotary body is mounted on said operation member slidably in the axial direction of said operation member, said operation member including means for urging said drive rotary body to said front non-actuation position and a restriction member for restricting the position of said drive rotary body in a manner so that rotation is allowed to be transmitted from said drive rotary body to said driven rotary body when said tuning member is held in said rear actuation position.

8. A push-button tuner according to claim 1, further comprising a pair of guide members respectively mounted on said pair of tuning members such that each of said guide members is responsive to the axial movement of its associated tuning member but not responsive to the rotation thereof, a swing member pivotally mounted on said support for alternately engaging with said pair of guide members for preventing the engaged one of said guide members from moving rearward, and a pivotal member pivotally mounted on said swing member for changing over the engagement of said swing member so as to cause said swing member to engage with one of said guide members in response to the movement of the other one of said guide members.

9. A push-button tuner according to claim 1, in which said actuator plate is disposed on said tuning members with a predetermined distance and supported by said support movably in the same direction as the moving direction of said tuning pieces, said actuator plate being frontward biased by an elastic member, and in which said operation member is provided with a butting portion which is located between the respective tuning pieces of said tuning members when each of said tuning piece of one of said tuning members existing in said front non-actuation position and said tuning piece of the other one of said tuning members existing in said rear actuation position is located at the front-most position of the associated tuning member so that said butting portion butts against said actuator plate when said operation member moves.

* * * * *